United States Patent [19]

Saidian

[11] Patent Number: 5,208,516

[45] Date of Patent: May 4, 1993

[54] TOUCH CONTROLLED ELECTRIC LIGHT SOCKET WITH HIGH CURRENT TOLERANCE

[76] Inventor: Jacob Saidian, 440 El Rio Rd., Danville, Calif. 94526

[21] Appl. No.: 719,355

[22] Filed: Jun. 24, 1991

[51] Int. Cl.$^5$ .............................................. H05B 37/07
[52] U.S. Cl. ................................... 315/362; 315/194; 323/904; 323/905; 323/324; 307/116; 307/157
[58] Field of Search .............. 315/362, 74, 194, 227 R; 323/324, 904, 905; 307/114, 116, 125, 157

[56] References Cited

U.S. PATENT DOCUMENTS

| | | | |
|---|---|---|---|
| 3,300,711 | 1/1967 | Duncan | 323/905 |
| 3,452,214 | 6/1969 | Martin | 307/96 |
| 3,496,451 | 2/1970 | Duncan | 323/905 |
| 3,666,988 | 5/1972 | Bellis | 315/362 |
| 3,715,623 | 2/1973 | Szabo | 315/194 |
| 4,101,805 | 7/1978 | Stone | 315/74 |
| 4,152,629 | 5/1979 | Raupp | 315/362 |
| 4,163,923 | 8/1979 | Herbers et al. | 315/208 |
| 4,211,959 | 7/1980 | Deavenport et al. | 315/362 |
| 4,289,972 | 9/1981 | Wern | 315/362 |
| 4,764,708 | 8/1988 | Roudeski | 315/362 |
| 4,816,698 | 3/1989 | Hook | 315/362 |

Primary Examiner—Paul M. Dzierzynski
Assistant Examiner—Michael B. Shingleton
Attorney, Agent, or Firm—Harris Zimmerman

[57] ABSTRACT

A light socket for engaging and energizing a light bulb is adapted for attachment to a lamp base or other light fixture and has an internal chamber in which a touch responsive control circuit is disposed. The circuit has a solid state switch element which transmits voltage to the bulb in response to a change of capacitance at an input terminal and which preferably progressively changes light output in response to successive changes of capacitance. Heat damage to the solid state switch element is avoided, enabling use of higher wattage light bulbs, by a heat sink member which extends from the switch element to a location at which it contacts the lamp or other light fixture. In the preferred form, the heat sink is electrically connected to the control circuit input terminal and, in conjunction with metallic portions of the lamp or other light fixture, further functions as a component of the touch sensing system.

5 Claims, 7 Drawing Sheets

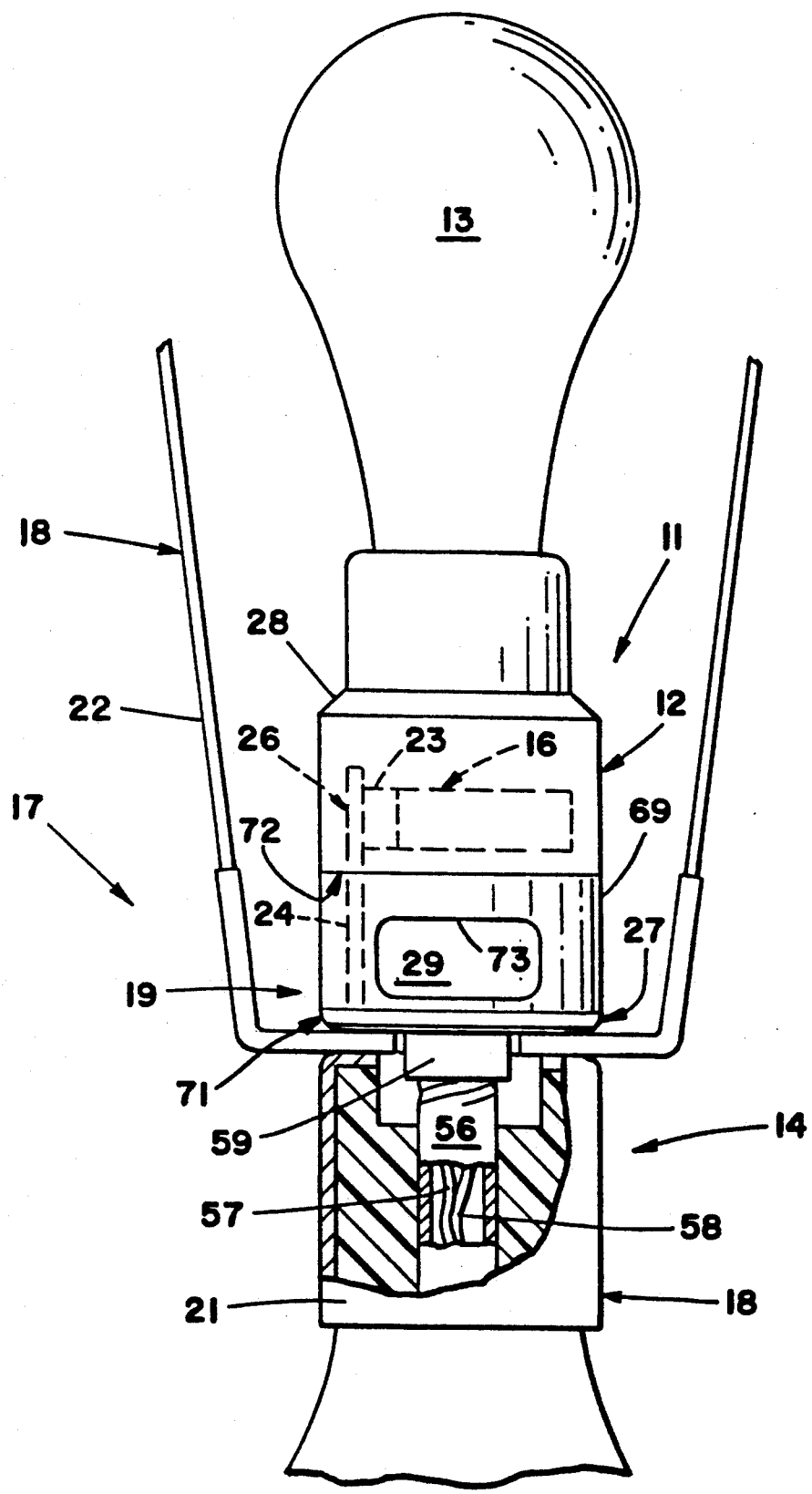
FIG_1

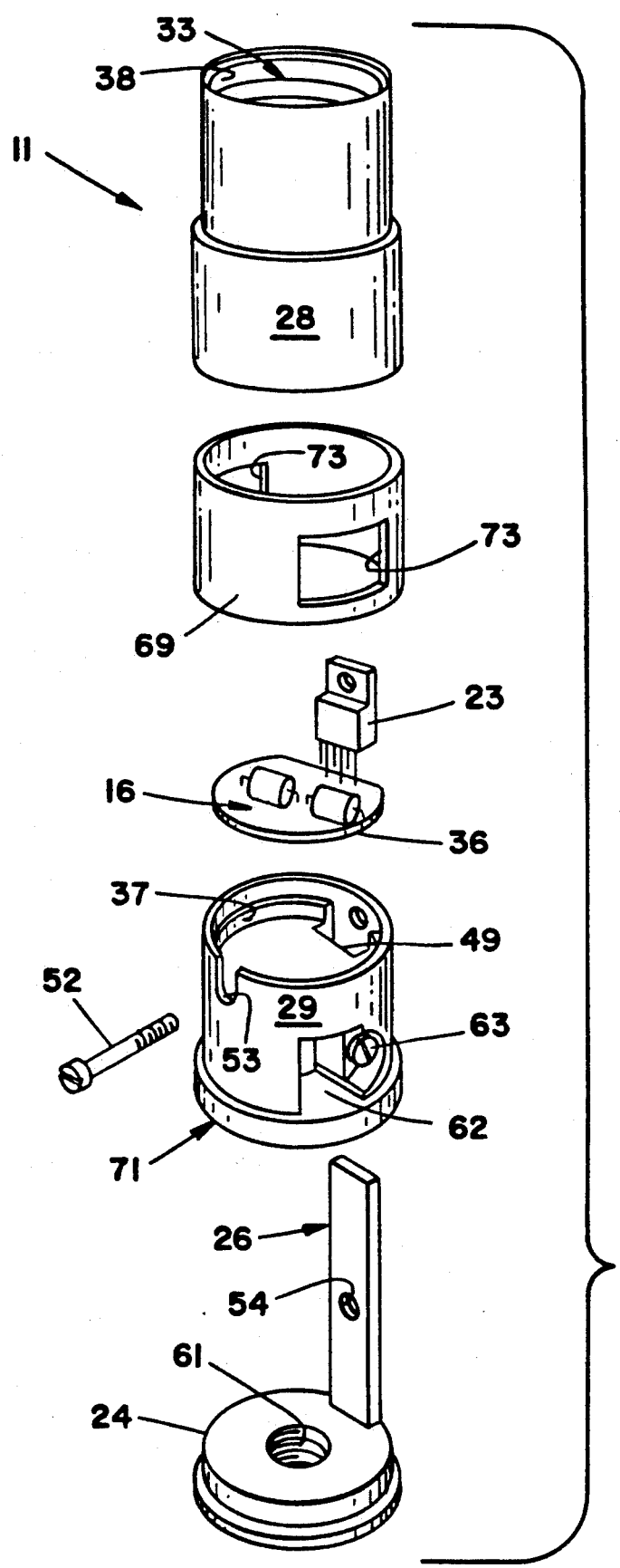
FIG_2

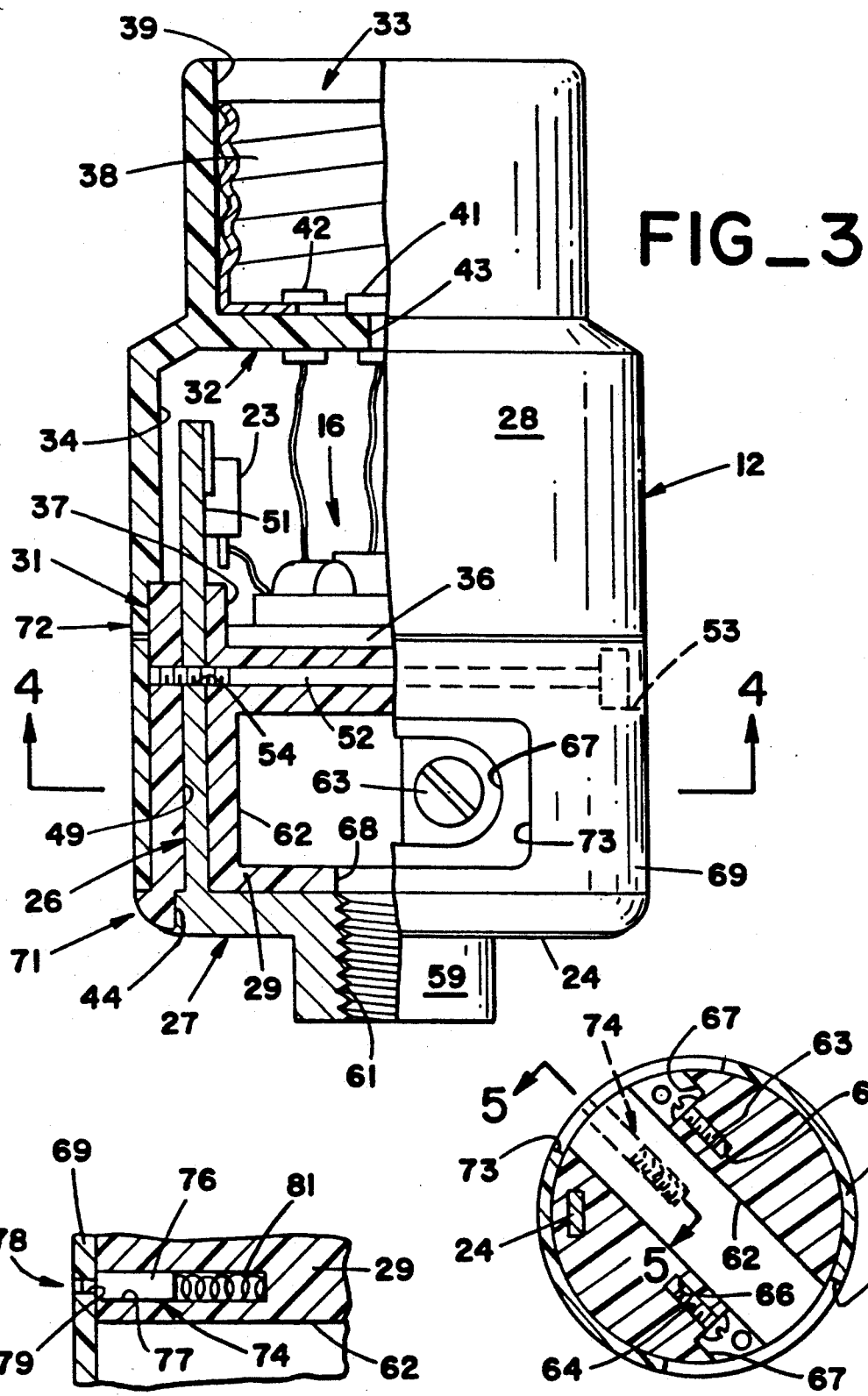

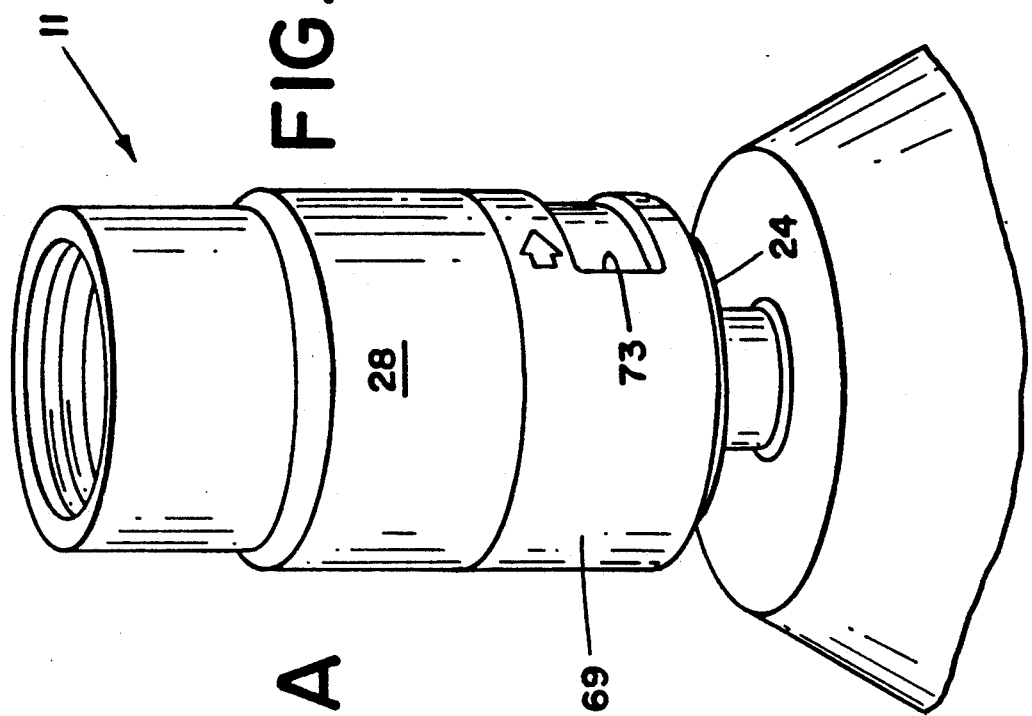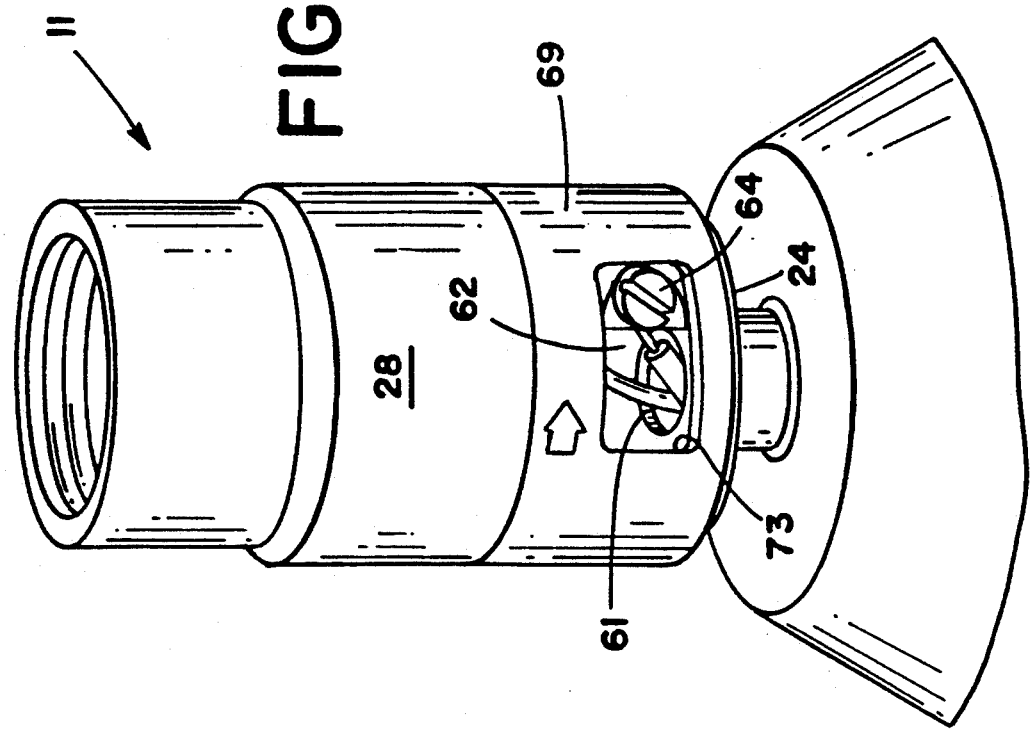

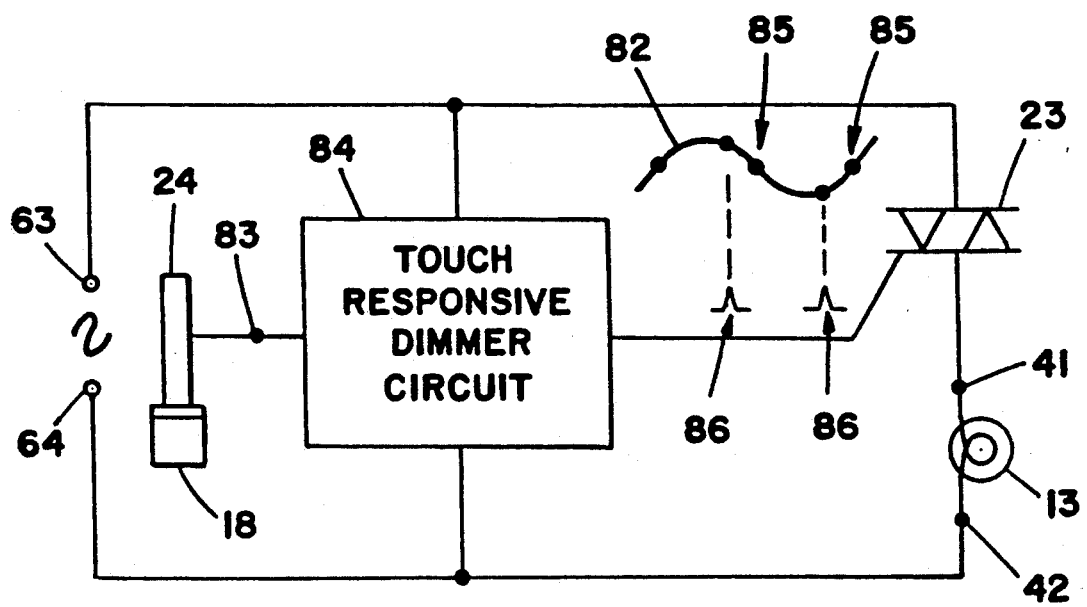
FIG_7
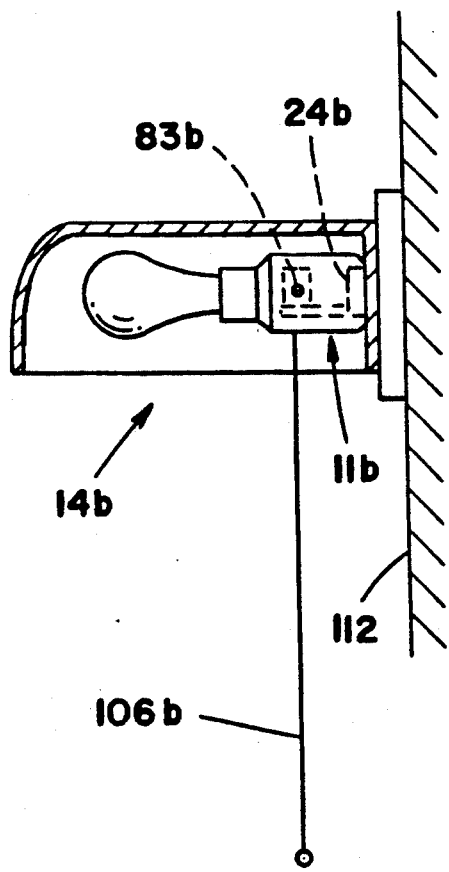
FIG_10

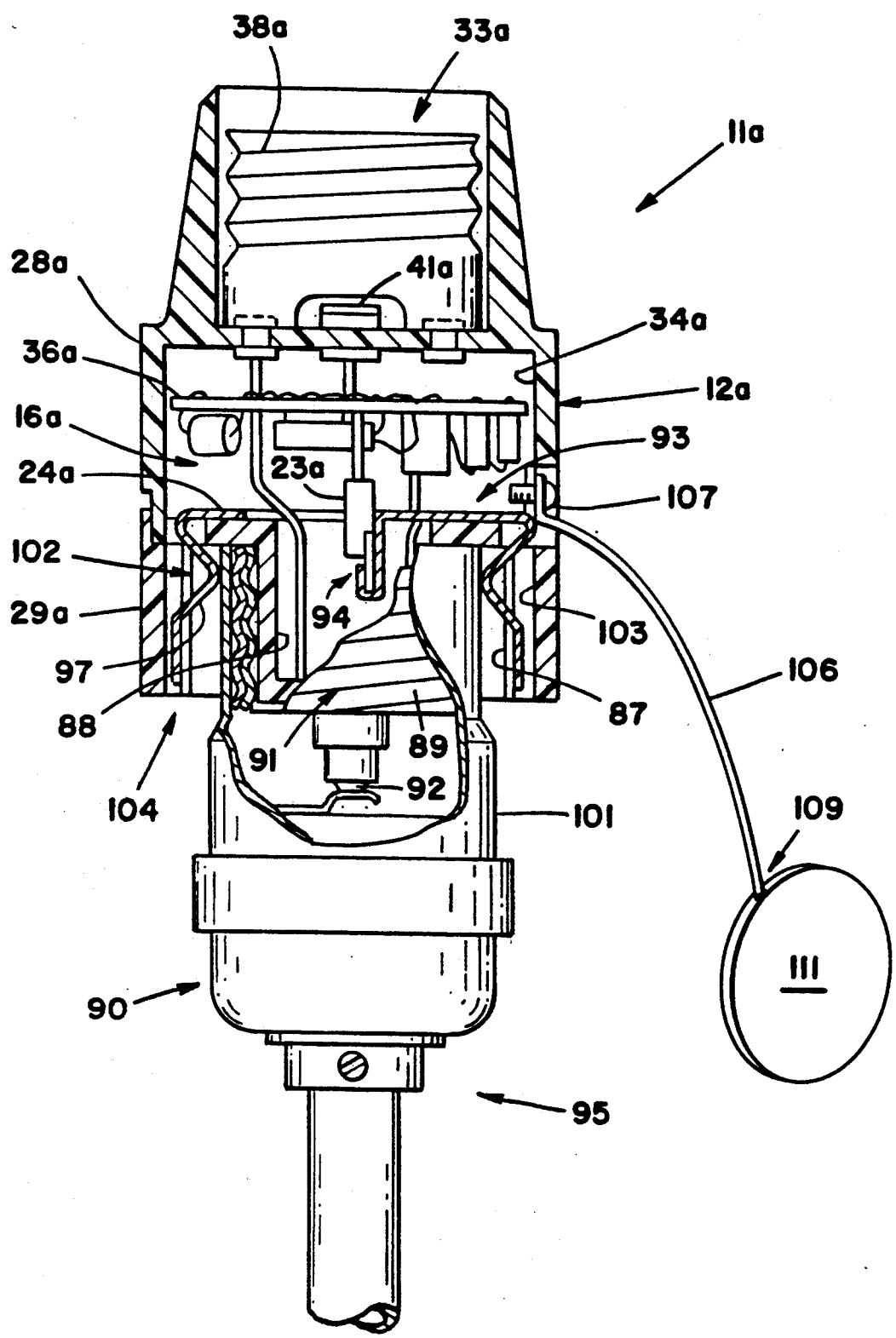
FIG_8

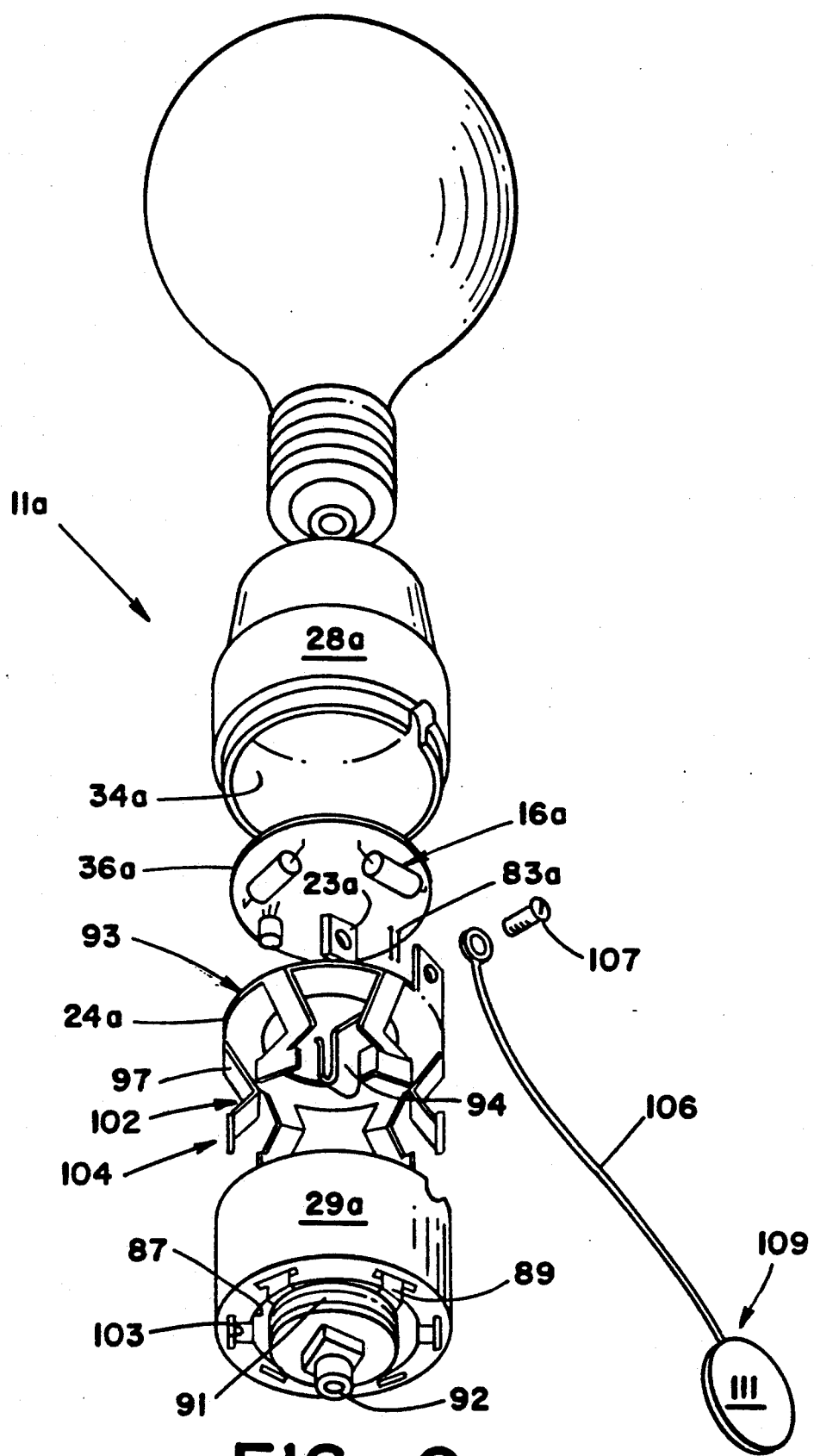
FIG_9

TOUCH CONTROLLED ELECTRIC LIGHT SOCKET WITH HIGH CURRENT TOLERANCE

TECHNICAL FIELD

This invention relates to electric light sockets for supporting and energizing light bulbs and more particularly to light sockets of the type which include a control circuit which turns the light bulb on and off in response to an operator's touch.

BACKGROUND OF THE INVENTION

A common form of electric light socket has a built in control switch to enable the lamp or light fixture to be turned on and off at the socket itself rather than by means of a remotely located switch. Traditionally, the control switch has been of the mechanical form which has a stem and rotatable knob that protrude from the side of the socket.

Rotary mechanical switches of this type wear rapidly and are notoriously prone to failure after repeated cyclings of the switch. Switch failure is particularly common in multi-level lighting fixtures which enable selection of any of a plurality of different levels of illumination as the switches for such fixtures are necessarily more complex.

Electronic switching circuits having solid state components are not subject to mechanical wear and thus can be much more durable in the absence of adverse environmental conditions. Such switching circuits are also more convenient to operate as the circuit can be controlled by simply touching an electrically conductive input component.

It has heretofore been recognized that touch operated electronic switching circuits can be substituted for the traditional mechanical switch in electric lamps or can be added on to existing lamps which have a mechanical switch by means of a supplementary socket which screws into the pre-existing socket of the lamp Such circuits operate in response to changes of capacitance at an input terminal that result from contact of an operator's finger with the terminal or with electrical conductors that are connected to the terminal. The touch controlled lamps or supplementary light sockets are usually constructed to establish an electrical connection between the switching circuit input terminal and metallic portions of the lamp base or other lighting fixture. Thus the lamp or other lighting fixture can be turned on and off by simply touching some metallic portion of the lamp or fixture.

The solid state circuit components which control the voltage that is applied to the bulb in touch operated switching circuits are susceptible to heat damage and can be unreliable or fail if subjected to overheating. Typically such components may have a maximum temperature tolerance of about 80° C. Such components inherently generate heat when conducting current and this must be dissipated to avoid a damaging temperature build-up. The problem is particularly acute in the context of a light socket as the light bulb itself produces heat and the socket can become very hot. Conventional heat sink arrangements for solid state circuit components may be inadequate in this context particularly if if a very high wattage bulb is engaged in the socket.

One effect of this problem is that prior touch operated light sockets are not suitable for use with very high wattage light bulbs. Use of a 300 watt bulb, for example, will very probably cause circuit failure from overheating.

Prior touch operated lighting installations have also required that the lamp as a whole have a specialized construction to accommodate the touch control circuit or, alternately, the complication of adding a supplementary socket to the pre-existing mechanically operated socket has been necessary. Prior touch controlled lamps or lighting fixtures are also unsuitable for use at elevated locations that cannot be conveniently reached by an operator.

The present invention is directed to overcoming one or more of the problems discussed above.

SUMMARY OF THE INVENTION

In one aspect of the present invention, an electric light socket for engaging and energizing a light bulb has a housing adapted for attachment to a support and a receptacle in the housing for receiving the base of the bulb. The socket further includes contacts in the receptacle for supplying electrical voltage to the bulb and a touch responsive control circuit in the housing. The control circuit includes an input signal terminal and a solid state switch element which transmits voltage to the contacts in response to a first change of capacitance at the input terminal and which ceases to transmit voltage in response to a subsequent change of capacitance. A thermally conductive heat sink member contacts the solid state switch element to receive heat from the element and extends away from the element to a location at which it contacts the socket supporting structure when the housing is attached to the support.

In another aspect of the invention, the heat sink member is electrically connected to the control circuit input terminal and serves as a touch sensing component of the control circuit in addition to serving as a heat dissipating element.

In another aspect, the invention provides an electric light socket having an insulative housing having first and second ends, a first chamber near the first end, a second chamber near the second end and a light bulb engaging receptacle at the first end. A pair of electrical power terminals are disposed in the second chamber and at least a pair of electrical contacts are situated in the receptacle to apply power to the bulb. A touch operated control circuit is disposed in the first chamber and has an input terminal and a switch component that transmits power from the power terminals to the contacts at any selected one of a plurality of power levels in response to successive changes of capacitance at the input terminal. A metallic heat sink member has an enlarged region at the second end of the housing and an arm which extends into the first chamber to receive heat from the switch component. A threaded passage in the enlarged region of the heat sink member enables engagement of the housing on a threaded support and entry of electrical power conductors into the second chamber for connection to the power terminals. The heat sink member is in electrically conductive contact with the input terminal of the control circuit.

In a further aspect of the invention, an electric light socket includes an insulative housing having first and second opposite ends, an internal chamber and a light bulb engaging receptacle at the first end. A first pair of electrical contacts in the receptacle supply electrical power to the bulb. A connector at the second end of the housing is adapted for engagement with a second light socket and has a second pair of contacts for receiving power from the second light socket. A touch operated electronic switch in the housing chamber has an input terminal and a switch component that is connected to one of the first contacts and one of the second contacts to transmit progressively greater amounts of power to the contacts in response to successive changes of capacitance at the input terminal. A thermally conductive metal heat sink member has an end which contacts the switch component to receive heat from the component. The heat sink member also has a plurality of resilient fingers that extend alongside the connector, in spaced apart relationship with the connector, and which are proportioned to contact an external surface of the second light socket as the connector is being engaged with the second light socket. The heat sink member is electrically connected to the input terminal of the control circuit.

In still another aspect of the invention, an electric light socket has a housing with a receptacle for receiving the base of a light bulb, contacts in the receptacle for transmitting voltage to the bulb and a connector for attaching the housing to a support. A touch responsive control circuit in the housing has an input terminal and means for energizing and de-energizing the bulb in response to changes of capacitance at the input terminal. A flexible electrically conductive cord has an end connected to the input terminal and extends outward from the housing to enable touch control of the light socket from a remote location when the socket is in an elevated light fixture or is otherwise inconvenient to reach.

The invention very effectively transfers heat away from a solid state switch component that transmits voltage to a light bulb within a touch controlled electric light socket and dissipates such heat through the socket support structure and the adjacent atmosphere. This prevents failure of the solid state switch component from the effects of excessive temperatures and enables usage of higher wattage bulbs in such light sockets. In one form of the invention, this is accomplished by a novel heat sink member which also functions to establish an electrical connection between the control circuit input and metallic portions of the lamp or other lighting fixture to which the socket is fastened. Thus the heat sink member also enables operation of the lamp or fixture by simply touching such metallic portions. In some embodiments of the invention, the heat sink member is also the connector through which the socket attaches to a support. These multiple functions of the single member enable a simple and economical light socket construction. Owing to the efficient heat transfer, it is not essential that the socket have a metal casing to dissipate heat and low cost plastic may be employed if desired. In another aspect, the invention also enables operation of touch controlled light sockets from a remote location when the socket is at an elevated location or is otherwise difficult to reach.

The invention, together with further aspects and advantages thereof, may be further understood by reference to the following description of the preferred embodiments and by reference to the accompanying drawings.

BRIEF DESCRIPTION OF THE DRAWINGS

FIG. 1 is a side view of a light socket in accordance with a first embodiment of the invention, the light socket being shown installed on a lamp base and with a light bulb engaged with the socket.

FIG. 2 is an exploded view of the first embodiment showing components in a disassembled condition.

FIG. 3 is an enlarged side view of the first embodiment of the light socket shown partially as a section view.

FIG. 4 is a cross section view taken along line 4—4 of FIG. 3.

FIG. 5 is a section view of a portion of the first embodiment taken along line 5—5 of FIG. 4.

FIGS. 6A and 6B are perspective views depicting opening and closing of a power terminal chamber of the device of the preceding figures.

FIG. 7 is a schematic circuit diagram illustrating electrical components and interconnections of the first embodiment.

FIG. 8 is an elevation section view of a second embodiment of the invention which is adapted for engagement with a pre-existing light socket in a lamp or other lighting fixture.

FIG. 9 is an exploded view of the second embodiment showing the components thereof in a disassembled condition.

FIG. 10 is a side view of a third embodiment of the invention which is a touch controlled light socket that may be operated from a remote location.

DETAILED DESCRIPTION OF THE PREFERRED EMBODIMENT

Referring initially to FIG. 1 of the drawings, an electric light socket 11 in accordance with this embodiment of the invention has a casing or housing 12 which receives the base of a light bulb 13 and which is adapted for attachment to a support 14. The support 14 in this example is the upper end of a table lamp base which may be of conventional construction but it should be recognized that the light socket 11 is also usable with other forms of lamp or lighting fixture including wall mounted fixtures or overhead fixtures.

As will hereinafter be described in more detail, housing 12 contains a touch responsive control circuit 16 of the known type that responds to application of a person's finger to the surface of one or more components of the socket 11 and/or the lamp 17 to which the socket is attached. In the present example, the bulb 13 may be turned on by touching metallic portions 18 of the lamp 17 that are in contact with the base 19 of socket 11 or by touching the socket base itself. In this particular example, the metallic portions 18 include a decorative metal cap 21 at the top of lamp base 14 and the metal harp 22 which is clamped between the lamp base and the socket base 19 for the purpose of supporting a lampshade (not shown). Other lamp or lighting fixture designs may have other forms of metallic surfaces that will serve the same purpose or such a surface can be provided as a component of the light socket 11 itself.

Control circuit 16 includes a triac or other solid state switch component 23 through which voltage is transmitted to the bulb 13. To avoid heat damage to the switch component 23 and to thereby enable use of very high wattage bulbs 13, socket 11 includes a metallic, thermally conductive heat sink member 24. The heat sink member 24 has an arm 26 that contacts switch component 23 to receive heat from the component and has a disk like enlarged region 27 that forms the base 19 of the light socket 11. Thus the member 24 transfers heat to the socket base 19 and adjacent support 14 where it is dissipated to the surrounding atmosphere by conduction, convection and radiation.

As will be further described, the heat sink member 24 of this embodiment of the invention also serves to connect the metallic portions 18 of lamp 17 to control circuit 16 and thus is a component of the touch sensing system. The member 24 of this embodiment is also the connector through which the socket 11 is attached to support 14. Use of the member 24 for these multiple purposes results in a simple and economical construction of the socket 11 as a whole.

Considering the construction of the light socket 11 in more detail, with reference jointly to FIGS. 2 and 3, housing 12 is formed by a first housing member 28 which is joined in end to end relationship with a second or base housing member 29 by adhesive 31 in this example, one end of the first member being overlapped with the adjacent end of the second member in the region of the adhesive joint. The first housing member 28 is essentially of hollow tubular configuration except that a transverse partition 32 in the member forms the base of a light bulb receiving receptacle 33 and, in conjunction with the second housing member 29, defines a first interior chamber 34 in which components of the control circuit 16 are disposed. The circuit 16 components, with the exception of the triac 23 that transmits A.C. voltage to the bulb, are preferably mounted on a circuit board 36 which seats in a conforming recess 37 in the second housing member 29 and which is secured to member 29 by adhesive or other means.

Bulb receptacle 33 may be of conventional configuration and thus includes an annular threaded neutral contact 38 secured within a cylindrical recess 39 at the end of housing member 28 and a disk-like center or hot contact 41 at the center of the base of the recess. Pins 42 and 43 extend through partition 32 to provide for electrical connections to contacts 38 and 41, respectively. One or more additional contacts can be provided in receptacle 33 in the known manner if the light socket 11 is to be adapted for use with multiple filament light bulbs.

The disk shaped region 27 of heat sink member 24 seats in a conforming recess 44 in the base of the second housing member 29. Arm 26 of the heat sink member extends into the first housing chamber 34 through a slot 49 in second housing member 29 that is located near the sidewall of the member. The triac 23 through which A.C. voltage is transmitted to contact 41 is disposed in first chamber 34 in contact with arm 26 and is preferably secured to the arm by adhesive 51 or other means. Heat sink member 24 is secured in place by a bolt 52 which extends transversely within the second housing member, from a notch 53 in the member that is opposite from the arm 26, and which engages in a threaded passage 54 in the arm.

Referring again to FIG. 1, lamp bases 14 of the type that this embodiment of the invention is designed for have a tubular threaded shaft 56 for securing a light socket 11 to the lamp and the A.C. power conductors 57 and 58 for energizing the socket extend within the shaft and out of the end of the shaft. Referring jointly to FIGS. 1 and 3, the base of heat sink member 24 has an annular boss 59 at the center of the base and an internally threaded bore 61 in the boss provides for fastening of the light socket 11 to lamp base 14 by engaging the boss on shaft 56.

Referring to FIGS. 3, 4 and 5 in conjunction, housing 12 has a second interior chamber 62 in the form of a transverse slot which extends across the second housing member 29 and in which a pair of A.C. power terminals 63 and 64 are situated. The terminals 63 and 64 are threaded screws which engage in threaded passages 66 in housing member 29 near opposite ends of the chamber 62. Passages 66 are situated in recesses 67 which are at opposite ends of the chamber 62 and at opposite sides of the chamber. The passages 66 are aligned in parallel relationship with the slot like chamber 62 to provide for access to the terminal screws 63 and 64 through opposite ends of the chamber.

Referring jointly to FIGS. 1 and 3, an opening 68 in housing member 29 is aligned with the threaded passage 61 of heat sink member 24. This enables entry of the A.C power conductors 57 and 58 into housing chamber 62 for connection to power terminals 63 and 64.

To prevent inadvertent entry of an operator's finger or other objects into the power terminal chamber 62, an annular turnable cover 69 encircles the second housing member 29. A flange 71 at the base of member 29 and the adjacent edge 72 of first housing member 28 prevent axial displacement of cover 69. Referring to FIGS. 3, 4 and 5, cover 69 has openings 73 at diametrically opposite locations. Openings 73 are turned into register with chamber 62, as shown in FIG. 6A, when access to the power terminals 63 and 64 is needed. Cover 69 may then be rotated to a closed position, depicted in FIG. 6B, at which both ends of the chamber 62 are covered.

Referring again to FIGS. 3, 4 and 5, detent means 74 are provided to resist turning of cover 69 away from the position at which the ends of power terminal chamber 62 are covered. Means 74 may include a small slidable plunger 76 disposed in a passage 77 in second housing member 29 and which has a pin 78 at the outer end which enters an aperture 79 in cover 69 when the cover is at the closed position. A compression spring 81 in passage 77 urges the plunger 76 into aperture 79. Plunger 76 may be retracted from aperture 79, to enable access to chamber 62, by forcing a small nail or the like into the aperture.

Referring to FIG. 7 which depicts electrical interconnections between the above described components, triac 23 and light bulb receptacle contacts 41 and 42 are connected in series across power terminals 63 and 64 to receive utility alternating current which is represented by waveform 82 in the drawing. Heat sink member 24 is electrically connected to the input terminal 83 of a touch responsive dimmer circuit 84 which transmits cyclical gating pulses to triac 23.

In general, circuits 84 of this kind operate by sensing the charge fluctuation which occurs when a person's finger touches an electrical conductor that is connected to the input terminal 83. Heat sink member 24 and such metallic portions 18 of the lamp that are in contact with the member are conductors of this kind in the present example. Triacs 23 and certain other gate controlled solid state switch components cease conducting at the end 85 of each half cycle of the applied alternating current 82 and do not resume conducting until a gate or trigger pulse 86 is received. Dimmer circuit 84 varies the timing of the trigger pulse 86 during each half cycle of the alternating current 82 in response to successive sensed touches to increase the electrical power that is being applied to light bulb 13 in response to each successive touch until full power is being delivered. Circuit 84 interrupts power transmission in response to the next touch and thereby turns the light bulb 13 off. Cycling through the several levels of brightness then resumes in response to the following touch.

Dimmer circuit 84 has not been described in detail as it may be of one of the known forms. Prior U.S. Pat. No. 3,715,623, which is hereby incorporated by reference, discloses details of one circuit which is suitable for the present purpose. U.S. Pat. Nos. 4,163,923 and 4,211,959 also disclose circuits of this kind. As a practical matter, circuits of this kind are commercially available in integrated circuit form. The present embodiment utilizes an HI-2410 Capacitive Touch Light Dimmer integrated circuit as manufactured by Holt Integrated Circuits, Inc., Irvine, Cal.

The above described embodiment of the invention is designed to be substituted for or to replace older types of socket. Referring jointly to FIGS. 8 and 9, the invention may also be embodied in a supplemental light socket 11a designed to engage in the pre-existing socket 90 of a lamp 95 or other lighting fixture.

Socket 11a has a housing 12a formed by two housing members 28a and 29a secured together in end to end relationship and a light bulb engaging receptacle 33a is secured within the outer end of the first housing member 28a. Receptacle 33a includes a first pair of contacts 38a and 41a which may be similar to the corresponding components of the first described embodiment. The first housing member 28a has a chamber 34a below receptacle 33a in which a circuit board 30a, carrying the components of control circuit 16a, is disposed. The control circuit 16a including a triac 23a through which alternating current is transmitted to contacts 38a and 41a may also be similar to their counterparts in the first described embodiment.

The second housing member 29a is formed with an annular recess 87 which extends inward from the end of the member that is opposite from the first member 28a and which encircles a cup shaped central portion 88 of the housing member 29a. Connection of the supplementary light socket 11a to another light socket is provided for by a metal sleeve 89 which is secured to portion 88 in coaxial relationship with the portion 88. Sleeve 89 has a diameter conforming to that of the base of a standard light bulb and has threads 91 similar to those of a light bulb thereby enabling the supplementary light socket to be screwed into the socket 90 of lamp 95. Sleeve 89 and a conductive disk 92 at the end of portion 88 constitute a second pair of contacts for receiving alternating current from the other socket.

As in the first described embodiment, the triac 23a of the control circuit 16a is secured to a thermally and electrically conductive heat sink member 24a which transfers heat from the triac and also provides an electrically conductive path between the control circuit input terminal 83a and conductive surfaces of the lamp 95 which surfaces typically include a cylindrical metallic casing 101 which encircles the socket 90 of the lamp 95.

Heat sink member 24a has an annular end portion 93 which seats on the top of the cup shaped central portion of the housing member 29a. A tab 94 portion of the heat sink member 24a extends down from end portion 93 into the cup shaped portion 88 and has a U-shaped end which clamps the triac 23a to conduct heat away from the triac. The heat sink member 24a also has a plurality of fingers 97 which extend downward from end portion 93 within recess 87 in position to contact the metal casing 101 which supports the light socket 90 of lamp 95.

Fingers 97 are equiangularly spaced around the annular end portion 93 of the heat sink member 24a and the midsection 102 of each finger is angled inwardly towards the central axis of the member. The heat sink member including fingers 97 is formed of a resilient material such as copper or aluminum and the angled midsections 102 of the fingers are positioned to be deflected apart slightly by the light socket casing 101 of lamp 95 thereby assuring good thermal and electrical contact with the casing. Below the midsection 102, each finger 97 extends into one of a series of vertical grooves 103 in the wall of recess 87. The region of each groove 103 that is outward from the wall of recess 87 is broader than the region that is adjacent the recess wall and the tip 104 of each finger is also broader than the inner region. Thus the groove 103 configuration holds the tips 104 within the grooves.

Operation of the light socket 11a is similar to that of the first described embodiment except insofar as the heat sink member 24a does not also function as the connector which attaches the socket 11a to a support.

The above described embodiments of the invention are actuated and deactuated by touching some metallic portion of the lamp or lighting fixture that is in electrical contact the the heat sink members. In instances where the lamp does of a short length of electrically conductive wire or cord 106 may be connected to the heat sink member 24a by means of a screw 107. Thus the lamp 95 may be operated by touching the distal end 109 of the cord 106. Cord 106 preferably has an enlargement 111 at the distal end 109 to facilitate such touching and to increase the sensitivity of the light socket 11a to such touching.

Referring to FIG. 10, some lamps or lighting fixtures 14b may be situated on an elevated location on a wall 112 or on a ceiling or otherwise be inconvenient to reach. The embodiment of FIG. 10 is provided with a longer conductive cord 106b of the above described kind to enable easy and convenient operation of the lighting fixture 14b. Fixture 14b may otherwise be similar to one of the previously described embodiments and is similar to the first described embodiment in this example.

The embodiments of the invention which are shown in the drawings are proportioned for use with light sockets of the type that is standardized in the United States of America. The proportions and configuration of the socket engaging elements may be changed as needed in order to be compatible with sockets of different size or configuration that are used in other countries.

While the invention has been described with reference to certain specific embodiments for purposes of example, many variations and modifications of the lamp socket construction are possible and it is not intended to limit the invention except as defined in the following claims.

I claim:

1. An electric light socket for engaging and energizing a light bulb, said socket having a housing adapted for attachment to a support, a receptacle in said housing for receiving the base of said bulb, contacts in said receptacle for supplying electrical voltage to said bulb, and a touch responsive control circuit in said housing which includes an input signal terminal and a solid state switch element through which current is transmitted to said contacts in response to a first change of capacitance at said input terminal and which ceases to transmit voltage to said contacts in response to a subsequent change of capacitance at said input terminal, wherein the improvement comprises a thermally conductive heat sink member disposed in contact with said solid state switch element to receive heat therefrom and which extends away from said switch element to a location at which said heat sink member contacts said support when said housing is attached thereto, wherein said light bulb receiving receptacle is situated at a first end of said housing, and wherein said heat sink member extends to the opposite end of said housing and has an enlarged region thereat and a threaded passage in said enlarged region for engaging a threaded portion of said support whereby said heat sink member serves as a connector for attaching said housing to said support, wherein said housing has a first internal chamber in which said solid state switch element is disposed, and wherein said heat sink member is a metallic body having an arm which extends from said enlarged region of said member into said first chamber and into contact with said solid state switch element.

2. An electric light socket for engaging and energizing a light bulb, said socket having a housing adapted for attachment to a support, a receptacle in said housing for receiving the base of said bulb, contacts in said receptacle for supplying electrical voltage to said bulb, and a touch responsive control circuit in said housing which includes an input signal terminal and a solid state switch element through which current is transmitted to said contacts in response to a first change of capacitance at said input terminal and which ceases to transmit voltage to said contacts in response to a subsequent change of capacitance at said input terminal, wherein the improvement comprises a thermally conductive heat sink member disposed in contact with said solid state switch element to receive heat therefrom and which extends away from said switch element to a location at which said heat sink member contacts said support when said housing is attached thereto, wherein said light bulb receiving receptacle is situated at a first end of said housing, and wherein said heat sink member extends to the opposite end of said housing and has an enlarged region thereat and a threaded passage in said enlarged region for engaging a threaded portion of said support whereby said heat sink member serves as a connector for attaching said housing to said support, wherein said housing has a second chamber situated between said first camber and said opposite end of said housing and has at least one access opening communicating with said second chamber, further including a pair of spaced apart power terminals situated in said second chamber and being electrically connected to said contacts, and wherein said passage in said enlarged region of said heat sink member communicates with said second chamber enabling current conductors to be inserted into said second chamber through said enlarged region of said heat member for connection to said terminals.

3. The apparatus of claim 2 further including a rotatable sleeve encircling said housing in the region of said second chamber, said sleeve having at least one open area and being rotatable relative to said housing between a first position at which said open area is in register with said access passage and a second position at which said sleeve covers said access passage.

4. The apparatus of claim 3 further including detent means for resisting rotation of said sleeve when said sleeve is at said second position thereof.

5. An electric light socket comprising:
an insulative housing having first and second opposite ends, a first chamber situated near said first end and a second chamber situated near said second end and further having a light bulb engaging receptacle at said first end;
at least a pair of electrical contacts disposed in said receptacle in position to supply electrical power to the light bulb;
a pair of electrical power terminals disposed in said second chamber,
a touch operated control circuit disposed in said first chamber and having an input terminal and a a switch component which is electrically connected to one of said terminals and one of said contacts to transmit electrical power therebetween at any selected one of a plurality of power levels in response to successive changes of capacitance at said input terminal, and
a metallic heat sink member, said member having an enlarged region at said second end of said housing and an arm which extends from said enlarged region into said first chamber to receive heat from said switch component, said heat sink member further having a threaded passage in said enlarged region for engagement with a threaded support and for enabling entry of electrical power conductors into said second chamber for engagement with said terminals, said heat sink member being in electrically conductive contact with said input terminal of said control circuit.

* * * * *